(12) United States Patent
Lunsman et al.

(10) Patent No.: US 10,881,030 B1
(45) Date of Patent: Dec. 29, 2020

(54) ELECTRICAL AND LIQUID COOLING MIDPLANE

(71) Applicant: HEWLETT PACKARD ENTERPRISE DEVELOPMENT LP, Houston, TX (US)

(72) Inventors: Harvey J. Lunsman, Chippewa Falls, WI (US); Steven Dean, Chippewa Falls, WI (US); Mike Kubisiak, Chippewa Falls, WI (US); Michael Scott, Chippewa Falls, WI (US); Robert Mascia, Chippewa Falls, WI (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/593,007

(22) Filed: Oct. 4, 2019

Related U.S. Application Data

(60) Provisional application No. 62/881,020, filed on Jul. 31, 2019.

(51) Int. Cl.
*H05K 7/20* (2006.01)
*H05K 1/18* (2006.01)
*H05K 7/14* (2006.01)

(52) U.S. Cl.
CPC .......... *H05K 7/20809* (2013.01); *H05K 1/18* (2013.01); *H05K 7/1487* (2013.01); *H05K 2201/10189* (2013.01); *H05K 2201/10545* (2013.01)

(58) Field of Classification Search
CPC ..... H01L 23/473; H01L 23/427; H01L 23/34; H01L 23/4006; H01L 23/3675;
(Continued)

(56) References Cited

U.S. PATENT DOCUMENTS 7,138,733 B2   11/2006   Sanders et al.
7,916,480 B2   3/2011    Woody et al.
(Continued)

OTHER PUBLICATIONS

Circuit Globe, "Electrical Bus-Bar and Its Types," available online at <https://web.archive.org/web/20171109163703/https://circuitglobe.com/electrical-bus-bar-and-its-types.html>, Nov. 9, 2017, 15 pages.

(Continued)

*Primary Examiner* — Mandeep S Buttar
(74) *Attorney, Agent, or Firm* — Hewlett Packard Enterprise Patent Department

(57) ABSTRACT

An example electrical and liquid coolant midplane includes an electrical midplane having a ring bus bar assembly, a liquid coolant manifold, and a heat transfer device. The ring bus bar assembly is to receive power from power supply units of the computing system and provide the power to computing components installed in the computing system. The liquid coolant manifold includes four segments connected together as a rectangular ring, the liquid coolant manifold including first liquid connectors facing in a first direction and second liquid connectors facing in a second direction opposite the first direction. The heat transfer device is in contact with the ring bus bar assembly and one of the segments of the liquid coolant manifold, to thermally couple the ring bus bar assembly with the manifold to provide liquid cooling to the ring bus bar assembly.

20 Claims, 12 Drawing Sheets

(58) Field of Classification Search
CPC ... H01L 23/367; H01L 23/46; H05K 7/20772; H05K 7/20254; H05K 7/20327; H05K 7/20272; H05K 7/20781; H05K 7/20236; H05K 7/20509; H05K 7/20927; H05K 7/20263; H05K 7/20281; H05K 7/20218; H05K 7/20809; H05K 1/18; H05K 7/1487; H05K 2201/10189; H05K 2201/10545; F28F 3/12; F28F 9/26; F28F 13/02; F28F 13/06; F28F 9/0258; F28F 9/027; G06F 1/20; G06F 2200/201; F28D 15/00; F28D 15/0266; F28D 2021/0029; F28D 15/0275
USPC ............... 361/699, 679.47, 679.53, 679.46; 165/104.33, 173, 104.28, 244, 80.2, 100, 165/104.19, 104.21, 104.22, 80.4
See application file for complete search history.

(56) References Cited

U.S. PATENT DOCUMENTS

| | | | |
|---|---|---|---|
| 8,035,972 B2 | 10/2011 | Ostwald et al. | |
| 8,866,465 B2 | 10/2014 | Simburger et al. | |
| 9,170,619 B2 | 10/2015 | Ying | |
| 9,320,166 B1 | 4/2016 | Marr et al. | |
| 9,342,414 B1 | 5/2016 | Nguyen et al. | |
| 9,442,540 B2 | 9/2016 | Nguyen et al. | |
| 9,593,876 B2 | 3/2017 | Smith | |
| 9,668,382 B2 | 5/2017 | Steinke et al. | |
| 9,861,012 B2 | 1/2018 | Krug et al. | |
| 2003/0057546 A1* | 3/2003 | Memory | F28D 7/0025 257/706 |
| 2005/0207134 A1* | 9/2005 | Belady | H05K 7/1445 361/796 |
| 2008/0259555 A1 | 10/2008 | Bechtolsheim et al. | |
| 2012/0097370 A1 | 4/2012 | Correa | |
| 2015/0124381 A1 | 5/2015 | Wu | |
| 2016/0356558 A1 | 12/2016 | Franz et al. | |
| 2017/0245402 A1 | 8/2017 | Borisov et al. | |

OTHER PUBLICATIONS

David Watts, "ThinkSystem SD650 Direct Water Cooled Server (Xeon SP Gen 1)", User Guide, available online at <https://lenovopress.com/lp0636-thinksystem-sd650-direct-water-cooled-server-xeon-sp-gen-1>, Apr. 16, 2019, 40 pages.

Mersen, "Solutions for Power Management Laminated Bus Bar Solutions", 2000, 36 pages.

Sahar et al., "Single phase flow pressure drop and heat transfer in rectangular metallic microchannels", Applied Thermal Engineering, 2016, pp. 1324-1336.

\* cited by examiner

ELECTRICAL AND LIQUID COOLING MIDPLANE

BACKGROUND

Computers include various components, such as processors and memory modules, among others. When in use, the components may generate heat, which, if left unchecked, may adversely affect the performance and health of the components of the computer. Thus, computers often include cooling solutions to cool (i.e., remove heat from) computing components.

DETAILED DESCRIPTION

Figure 1:
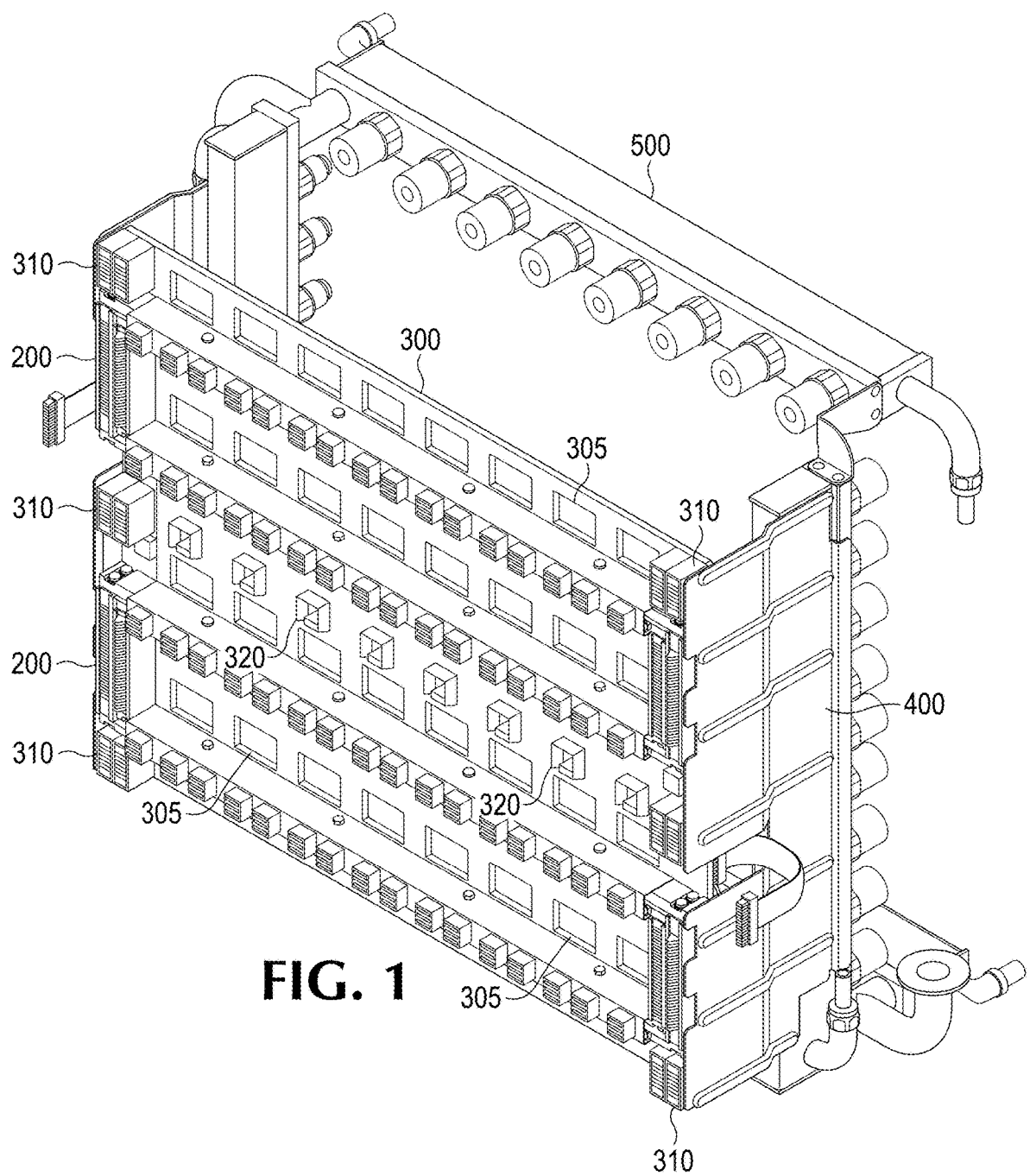
FIG. 1 illustrates a perspective view of an example electrical and liquid cooling midplane assembly.

One approach to cooling computing components is to cause air to flow through the computing system. Heat from the components is dissipated into the air (in some cases, with the aid of a heat sink), and then as the air flows out of the system it carriers the heat with it. However, in some circumstances, this air cooling approach may be suboptimal for some computing components, especially high power components such as processors and memory modules. For example, in modern high performance systems, each memory module may generate 12 W of heat or more, and each processor (CPU, SoC, etc.) may generate 250 W of heat or more. Thus, for example, a four-socket node board with eight memory modules per socket could generate 1384 W or more just from the processors and memory modules. In order to sufficiently air cool these high power components, the system designer may have to make undesirable tradeoffs in other parameters, such as increasing the size of the computing device, increasing the power consumption (e.g., to power more or bigger fans, or higher fan speeds), increasing the noise generated by the system (due to more or bigger fans, or higher fan speeds), etc. In addition, air cooling of computing devices results in hot air being exhausted from the devices, the handling of which presents challenges for computing system and data center design. Thus, while air cooling may be a preferred cooling solution in many contexts, there are other contexts (particularly in high performance computing) in which air cooling might not be good enough.

Thus, for these and other reasons, liquid cooling is being pursued as an alternative approach to cooling computing components. Liquid cooling involves flowing liquid coolant (e.g., water) through a cooling loop in a computing system and thermally coupling the liquid coolant to the components that need to be cooled, so that heat generated by the components is transferred into the liquid coolant and carried out of the computing system. Generally, the component to be cooled is thermally coupled to the liquid coolant by a device called a cold plate.

Historically, in what may be termed a hybrid-cooling approach, liquid cooling solutions have been deployed together with air cooling solutions in the same computing device. For example, under such a hybrid-cooling approach, certain higher powered components of a computing device, such as processors, may be liquid cooled, while the remaining components within the computing device may be air cooled. In such systems, it may be possible for as much as 70-80% of the heat generated by the computing device to be removed by the liquid coolant, with the air cooling solution removing the remaining 20-30%. Such an approach can be effective at cooling some computing devices.

However, although the hybrid-air cooling approach may provide sufficient cooling in some circumstances, it suffers from other drawbacks that may make it undesirable in other circumstances. In particular, the fans that are needed for forcing the air through the computing device consume a lot of power, generate a lot of noise, emit electro-magnetic interference (EMI) emission, and take up space within the computing device (or system chassis in a multi-node system). Moreover, if the computing device or system chassis is not a closed system with air recirculation, then the air blowing through the computing device may introduce contaminants (e.g., dust) into the device that can degrade the performance of the system. Such contaminants may be reduced by using filters and clean rooms, but these countermeasures have a cost, and are not 100% effective. Furthermore, in some circumstances it is desirable to increase the amount of heat that can be captured by the liquid coolant, as heat captured by the liquid coolant can often be recycled in a useful way (e.g., for facility heating).

Accordingly, to overcome some of the difficulties noted above, example computing systems disclosed herein may deploy liquid cooling solutions that may reduce, or even eliminate, the need to rely on air cooling. In some examples, the computing systems are 100% liquid cooled, without any fans or other air movers.

In particular, examples disclosed herein include a power and cooling midplane assembly, which provides both power and cooling infrastructure for a system chassis. The midplane assembly is located in a middle of the system chassis, between one compartment that houses first computing device (e.g., server nodes) and another compartment that houses second computing devices (e.g, switches). The midplane assembly includes a ring shaped power bus bar to provided pooled power to the computing devices, and a ring shaped liquid manifold to provide liquid coolant to the computing devices in both compartments.

The ring bus bar of the midplane assembly generates heat, and therefore needs to be cooled. In a fan-less system, no air is circulated to cool such a bus bar, and therefore the ring bus bar needs to be liquid cooled. However, it can be difficult to liquid cool such a ring bus bar with traditional liquid cooling devices like CPU cold plates, as the shape and location of the bus bar may make such approaches infeasible. In addition, bringing the liquid coolant into very close proximity to the bus bar might not be desirable from a safety perspective.

Thus, in examples disclosed herein, in order to cool the ring bus bar, a special heat transfer device is used to thermally couple the ring bus bar directly to the liquid manifold. The heat transfer device may be a plate of conductive metal, such as copper, with heat pipes coupled to the plate. One end of the heat transfer device may be in flush contact the ring bus bar, and the other end of the heat transfer device may be in flush contact with the liquid manifold. Thus, heat may be conducted out of the ring bus bar and directly into the liquid manifold via the heat transfer device. Accordingly, the ring bus bar may receive the cooling that it needs, without having to deploy a traditional cold plate for the ring bus bar and without having to bring the liquid coolant to the bus bar.

Additional advantageous features of the example computing systems will be described in greater detail below with reference to certain detailed implementation examples. It should be understood that the implementation examples described below are merely some examples of how the computing systems could be implemented, and that other examples of the computing systems could omit some of the features described below and/or could include additional features not described below. Moreover, it should be understood that features described in relation to one implementation example could be included in another implementation example even if not shown or described.

1. Example Electrical and Liquid Cooling Midplane Assembly

An example electrical and liquid cooling midplane assembly 100 will now be described. In the description below, as features of the midplane assembly 100 are described, figures that are particularly relevant to the feature under discussion will be identified. Thus, the figures will not necessarily be described in strict numerical order. Some features may be visible in many of the figures, but in some cases only one or a few of the figures thought to be most useful to understanding that feature will be pointed out.

As shown in FIG. 1, the midplane assembly 100 includes a midplane printed circuit board (PCB) 300, one or more ring bus bars assemblies 200 (two are shown in FIG. 1), one or more bus bar heat transfer plates 400 (two are shown in FIG. 1), and a ring shaped liquid manifold assembly 500. The ring bus bars 200 are attached and electrically connected to the midplane PCB 300 (see FIG. 1), and the heat transfer plates 400 are attached and thermally coupled to the ring bus bars 200 and the manifold assembly 500 (see FIGS. 1-3). Thus, the heat transfer plate 400 removes heat from the ring bus bars 200 and transfers the heat into manifold assembly 500 (from which the liquid coolant ultimately removes the heat).

As shown in FIGS. 9-12, the midplane assembly 100 is located in a middle region of the computing system 10, with the midplane PCB 300 dividing a first compartment 20 that houses first computing devices 700 (e.g., server nodes) from a second compartment 30 that houses second computing devices 800 (e.g., switches). In this location, the midplane assembly 100 is able to provide electrical and liquid cooling resources to both compartments 20, 30, The aforementioned parts of the midplane assembly 100 will now be described in greater detail.

1.1 Midplane PCB

As noted above, the midplane PCB 300 divides the first compartment 20 from the second compartment 30. The primary function of the midplane PCB 300 is to distribute signals (both communication and power signals) to the devices in the compartments 20, 30.

As shown in FIG. 1, the midplane PCB 300 supports the ring bus bars 200, which are to supply electrical power to the devices 700 in the first compartment 20. The ring bus bars 200 are disposed on a first side of the PCB 300 that faces the first compartment 20, and they include electrical connectors 235 to supply power to the first computing devices 700. The midplane PCB 300 and the ring bus bar assemblies 200 may be referred to collectively herein as an electrical midplane. The ring bus bars 200 will be described in greater detail in section 1.2 below.

Figure 2:
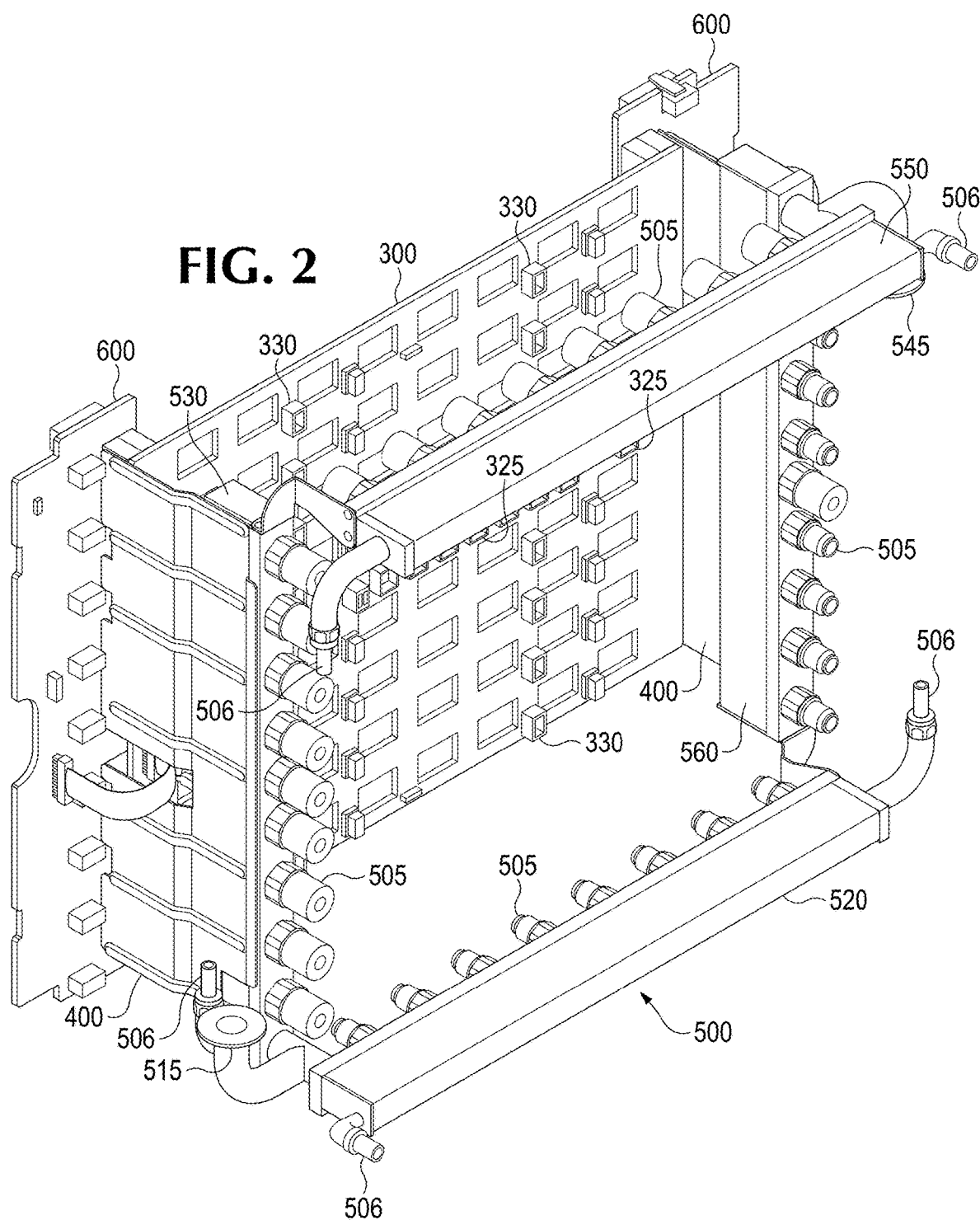
FIG. 2 illustrates another perspective view of the example midplane assembly of FIG. 1.

As shown in FIG. 1, the first side of the midplane PCB 300 may also include multiple louvered power connectors 310. These louvered power connectors 310 may electrically connect to power output connectors of a power supply unit (PSU) board 600 (see FIGS. 2, 3, 11, and 12). The system 10 may include two PSU boards 600, which each include a number of electrical connectors 601 (see FIG. 11) to electrically connect to the power outputs of PSUs housed in a PSU chassis 13 (see FIGS. 9 and 10). Thus each PSU board 600 receives the pooled power of multiple PSUs, and a portion of that power is supplied from the board 600 to the louvered power connectors 310 (a portion of the power is also supplied from the board 600 to the ring bus bars 200, as described in section 1.2 below). In some examples, the power received by the louvered power connectors 310 may be provided to second computing devices 800 in the second compartment 30. For example, as shown in FIG. 2, the second side of the midplane PCB 300 may include electrical connectors 330, which may be connected to the louvered power connectors 310 (e.g., via traces on or in the board 300) to provide power to the second computing devices 800.

As shown in FIG. 1, the first side of the midplane PCB 300 also includes connectors 325 facing into the first compartment 20. The connectors 320 may carry communications signals, such as electrical and/or optical communications signals. In some examples, the connectors 320 are communicatively coupled to connectors 325 that are on a second side of the midplane PCB 300 (see FIG. 2). In some examples, the connectors 320 and 325 may be for communicatively connecting the first computing device 700 and a system or chassis controller that is housed in the second compartment 30 (the system or chassis controller being one of the second computing devices 800).

In some examples, the midplane PCB 300 may include openings 305. The openings 305 may, for example, allow the first computing devices 700 to connect directly to the second computing devices 800. For example, a connector of a first computing device 700 may pass through the opening 305 as the first computing device 700 is inserted into the first compartment 20, and may blind mate with a corresponding connector of the second computing device 800 (or vice-versa).

1.2 Ring Bus Bar Assemblies

Figure 4:
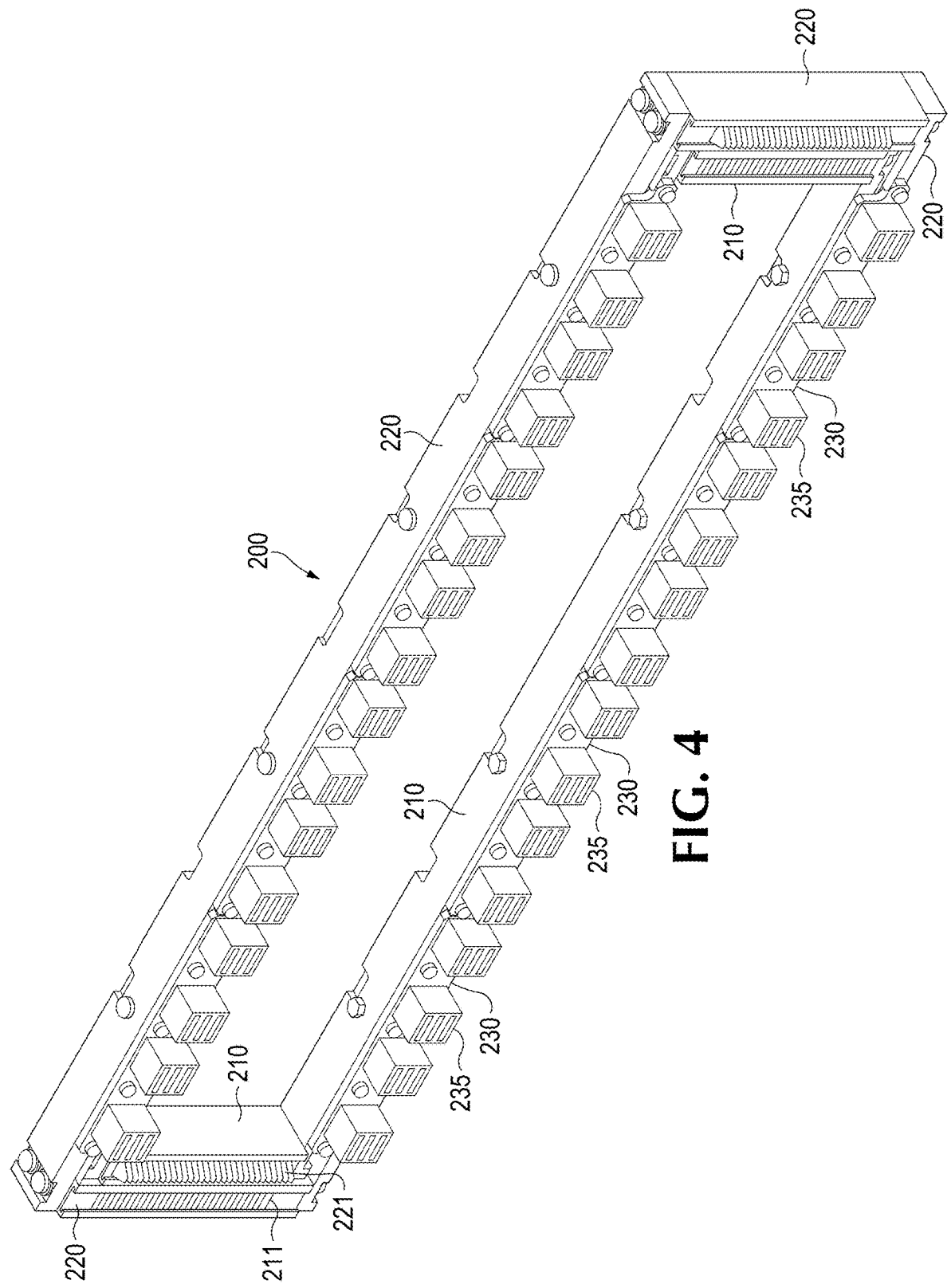
FIG. 4 illustrates a perspective view of a ring bus bar of the example midplane assembly of FIG. 1.
Figure 5:
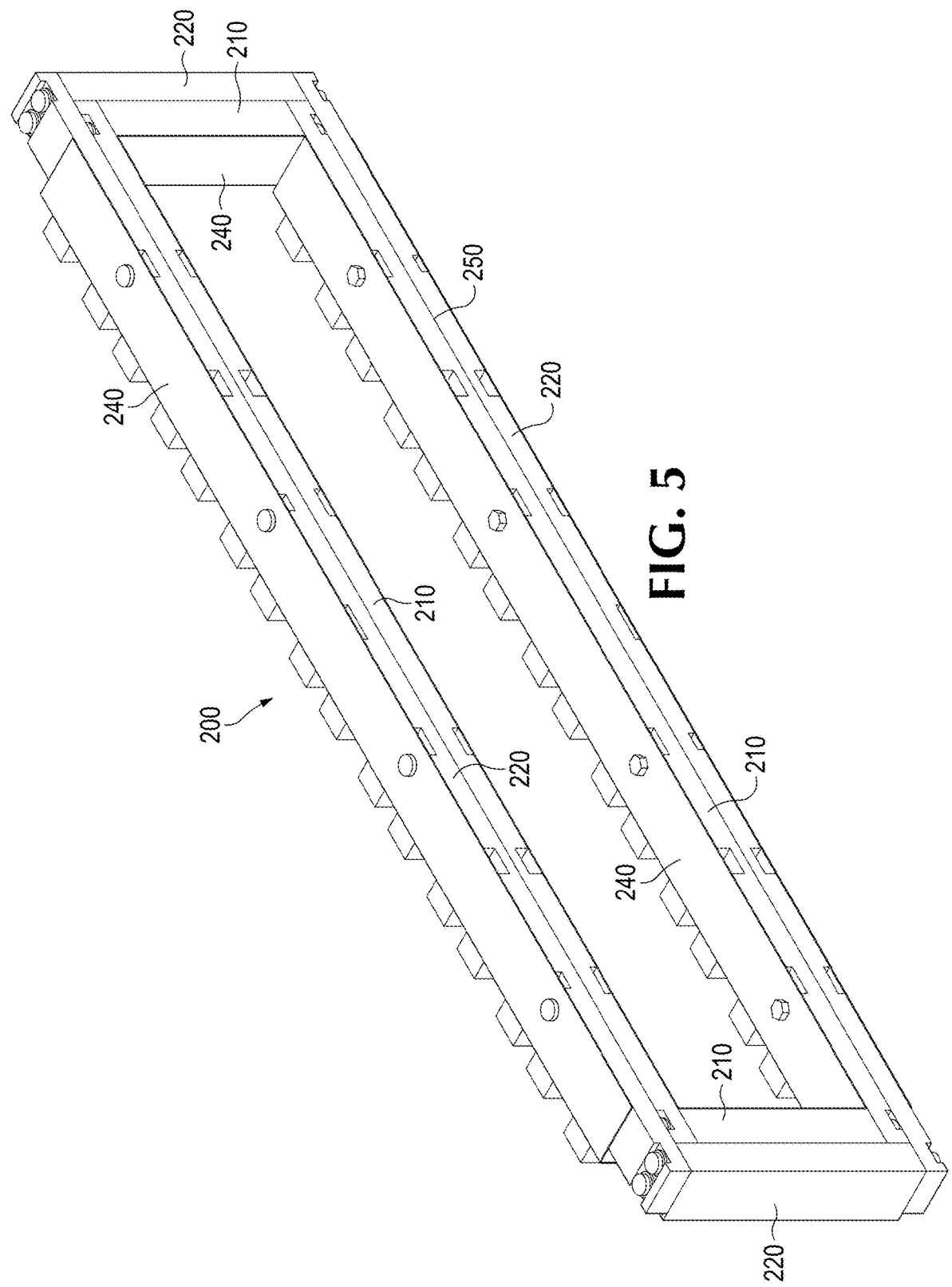
FIG. 5 illustrates another perspective view of the ring bus bar of FIG. 4.

As shown in FIGS. 4 and 5, each ring bus bar assembly 200 comprises a live bus bar 210 and a ground bus bar 220. The live bus bar 210 is "live" or "hot", meaning it carries a positive (or negative) voltage relative to ground. The ground bus bar 220 is grounded (earthed). As shown in FIGS. 4 and 5, both the live and ground bus bars 210, 220 are ring shaped (i.e., they form a closed loop).

More specifically, the live bus bar 210 includes two electrically conductive bars that run horizontally and span the midplane PCB 300, and two electrically conductive bars that run vertically and are affixed and electrically connected to the horizontal bars. The vertical bars physically and electrically connect the horizontal bars together at both ends thereof, forming a rectangular ring. The horizontal bars have electrical connectors 235 physically and electrically connected thereto (via circuit boards 230). The vertical bars each have a louvered electrical connection 211 (see FIG. 4), which is electrically connected to a power output of the PSU board 600 (see FIG. 2). Thus, power from the PSUs is delivered to the live bus bar 210 from both left and right sides via the louvered electrical connectors 211, and this power flows down the horizontal bars to the electrical connectors 235. The electrical connectors 235 are to connect to the first computing devices 700 (e.g., node boards) to provide electrical power thereto (see FIG. 11).

The ground bus bar 220 is similarly structured, with horizontal and vertical bars connected together in a rectangular ring. The ground bus bar 220 also includes louvered electrical connectors 221 to connect to the PSU boards 600. The electrical connectors 235 are also electrically connected to the ground bus bar 220 (via circuit boards 230).

The horizontal and vertical bars may be formed from, for example, highly electrically conductive materials, such as copper. In some examples, the bars are solid bars of the conductive material. In other examples, the bars may be hollow; for example, each bar may be constructed from plates or sheets of the conductive material that are shaped and/or joined together to form the hollow bar.

As shown in FIGS. 4 and 5, the ground bus bar 220 encircles (surrounds) the live bus bar 210. This nested arrangement puts the ground bus bar 220 in close proximity to the live bus bar 210, allowing the ground bus bar 220 to thermally couple with and absorb heat generated by the live bus bar 210. More specifically, a relatively thin electrical isolation layer 250 is disposed between and in contact with the live bus bar 210 and the ground bus bar 220, which enables the thermal coupling. Because the ground bus bar 220 is adjacent to the live bus bar 210 (via the layer 250) along all of its outer perimeter surfaces, a surface area of the thermal interfaces between the two bars (via the layer 250) is relatively large—much larger than it would be if, for example, the two bars merely abutted one another along one side. This larger area of thermal interface improves the rate of heat transfer from the live bus bar 210 into the ground bus bar 220. This ability of the ground bus bar 220 to effectively absorb the heat generated by the live bus bar 210 is important because it enables the heat transfer devices 400 to remove the heat generated by the entire ring bus bar 200 by contacting just the ground bus bar 220, eliminating any need to provide a separate heat transfer device specifically for the live bus bar 210. This is beneficial in that it reduces the number of cooling devices that are needed, and also because it avoids the possible complications that would arise in coupling a cooling device to a bar that is carrying live power.

In addition, the ring configuration of the ring bus bar 200 puts the ground bus bar 220 in a position in which it is easily accessible to make contact with the heat transfer devices 400. In particular, vertical bars of the ground bus bar 220 are arranged along an outer edge of the midplane PCB 300, enabling the heat transfer devices 400 to make contact with outward facing side surfaces of each of the vertical bars of the ground bus bar 220. This outward facing surface of the ring bus bar 200 provides a good amount of surface area for thermal coupling with the heat transfer devices 400.

The thin electrical isolation layer 250 that is disposed between and in contact with the live bus bar 210 and the ground bus bar 220 serves two purposes. First, it prevents shorts between the two bars 210, 220. Second, it thermally couples the two bars 210, 220 together, as described above. Thus, in some examples, the electrical isolation layer 250 may be thermally conductive and electrically non-conductive in its thickness dimension. The electrical isolation layer 250 may have a certain thickness.

The nested configuration of the ring bus bar 200 also allows the ground bus bar 220 to cover and protect the outward facing sides of the live bus bar 210. This may prevent inadvertent contact being made (by a person, a tool, a computing device, etc.) with of the live bus bar 210. Other portions of the live bus bar 210 (as well as the ground bus bar 220 and the circuit boards 230) may be covered with a protective covering 240.

1.3 Heat Transfer Device

Figure 3:
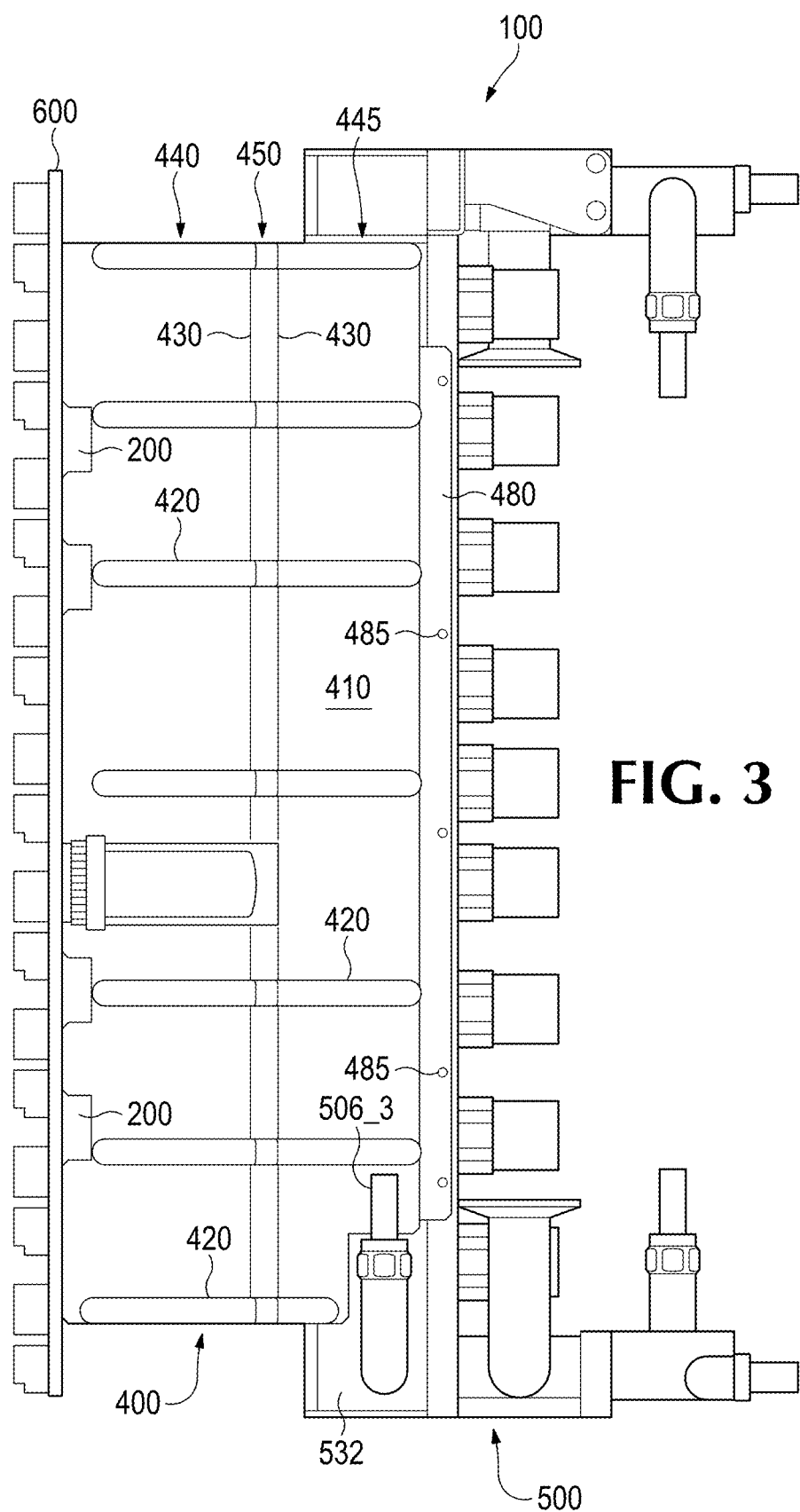
FIG. 3 illustrates a side plan view of the example midplane assembly of FIG. 1.

As mentioned above, the heat transfer device 400 is to remove heat from the ring bus bars 200, and transfer the heat to the liquid manifold assembly 500. Thus, as shown in FIGS. 1-3, the heat transfer device 400 is coupled (physically and thermally) at one end to the ring bus bar 200 and at the other end to the liquid manifold assembly 500. In addition, the heat transfer device 400 may also contact the sides of the louvered power connectors 310 of the midplane PCB 300 to remove heat therefrom. In the illustrated example, two heat transfer devices 400 are used, one on each side of the assembly 100.

Figure 7:
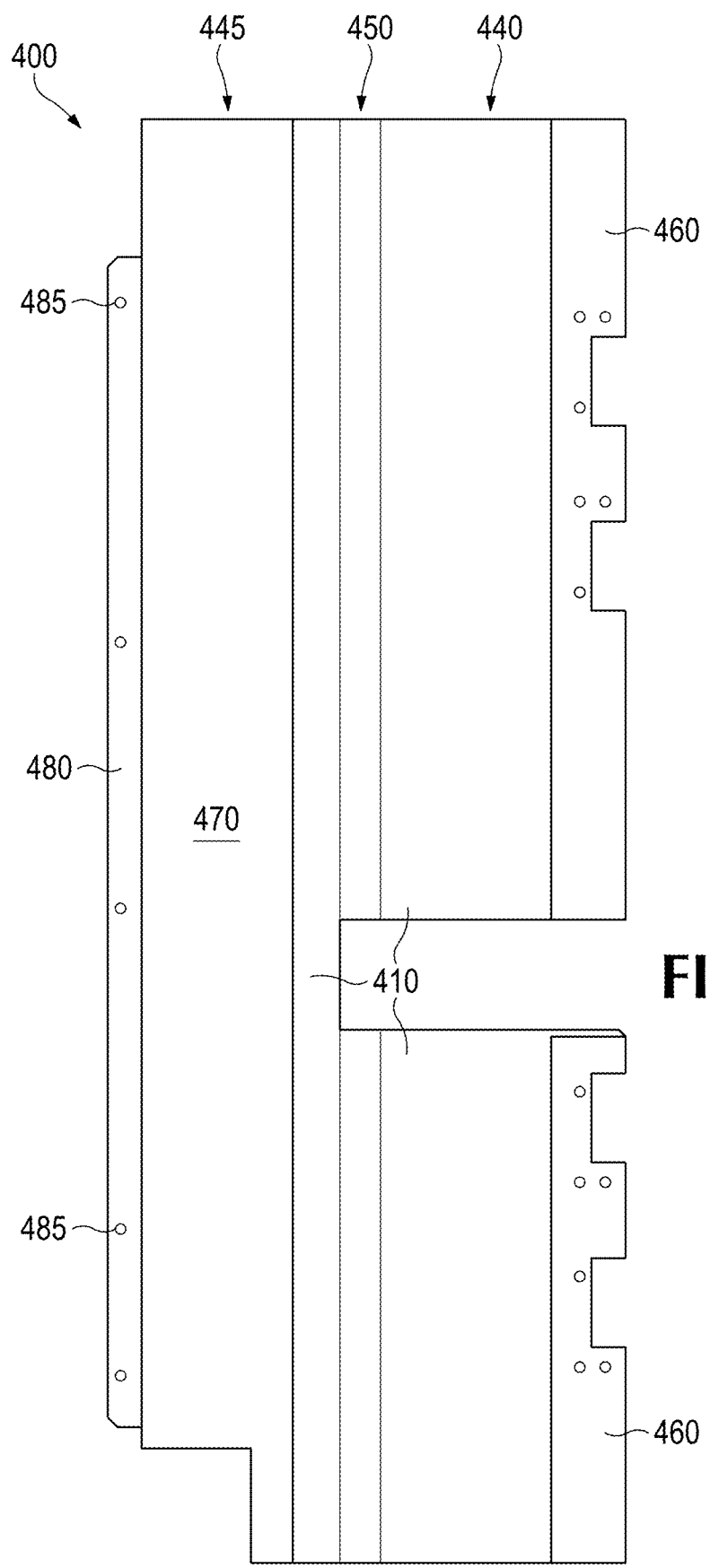
FIG. 7 illustrates a top plan view of an example heat transfer device of the example midplane assembly of FIG. 1.
Figure 8:
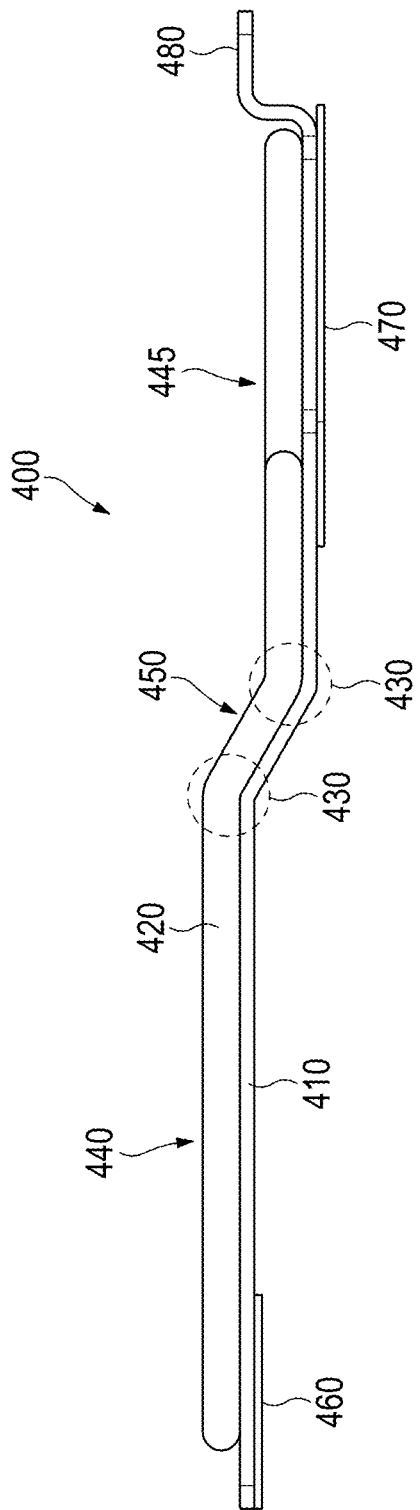
FIG. 8 illustrates a side plane view of the example heat transfer device of FIG. 7.

The heat transfer device 400 includes a base plate 410, formed from a plate or sheet of thermally conductive material (e.g., copper) (see FIGS. 3, 7, and 8). As shown in FIG. 3, the base plate 410 may extend vertically along nearly the entire height of midplane PCB 300, and may extend horizontally from the midplane PCB 300 to the liquid manifold assembly 500, which is offset horizontally from the midplane PCB 300. In some examples, the heat transfer plate 410 may include a cutout region through which may pass a communications cable that connects the midplane PCB 300 to the PSU board 600.

The heat transfer device 400 also includes heat pipes 420, which are attached to the base plate 410 (see FIGS. 1-3 and 8). The heat pipes 420 may extend horizontally from one end of the base plate 410 to the other (see FIGS. 3 and 8). In some examples, the heat pipes 420 are permanently attached to the base plate 410, such as by soldering, brazing, welding, etc. In some examples, the heat pipes 420 are located vertically so as to coincide with the ring bus bars 200 and/or the louvered power connectors 310. For example, as shown in FIG. 1, heat transfer device 400 has a heat pipe 420 located on/over each of the louvered power connectors 310, and two heat pipes 420 located on/over each of the ring bus bars 200.

As shown in FIG. 7, the heat transfer device 400 may include a bus bar interface 460 and a manifold interface 470. The bus bar interface 460 is a portion of the heat transfer device 400 that is to make flush contact with the side of the ring bus bar 200 (and also the louvered power connectors 310, in some examples), and thereby thermally couple them. Similarly, the manifold interface 470 is a portion of the heat transfer device 400 that is to make flush contact with a side surface of a vertical segment of the liquid manifold assembly 500 (specifically, the thermal interface surfaces 532 or 562), and thereby thermally couple them. In some examples, the bus bar interface 460 and the manifold interface 470 may include a thermal interface material (TIM), which is disposed between the base plate 410 and the ring bus bar 200 and/or liquid manifold assembly 500 to improve the rate of heat transfer.

In some examples, the heat transfer device 400 may cover and be in flush contact with the thermal interface surface 532 or 562 across a majority of the surface. This large area of thermal interface may help to ensure sufficient heat transfer rates are achieved. This may be especially helpful in circumstances in which the manifold 500 is formed from materials (such as steel) that, while thermally conductive, are not highly thermally conductive.

In some examples, the heat transfer device 400 may cover and be in flush contact with the side wall of the vertical bar of the ground bus bar 220 across a majority of the surface of that side wall. This helps to ensure sufficient heat transfer rates are achieved. However, because the ground bus bar 220 may, in some examples, be constructed of a highly thermally conductive material (e.g., copper, aluminum, etc.), the area of bus bar interface 460 may be much smaller than that of the manifold interface 470 while still maintaining sufficient heat transfer rates.

In some examples, the heat transfer device 400 may include bends 430 (see FIG. 8). This may enable the heat transfer device 400 to still provide flush contact with the ring bus bar 200 and the liquid manifold assembly 500 even when the contact surfaces thereof are not co-planar. Thus, the heat transfer device 400 may include, for example, a lower portion 445, an upper portion 440, and a sloped portion 450 connecting the lower and upper portions 445, 440.

The heat transfer device 400 may also include attachment features to allow it to be attached to the ring bus bar 200 and the liquid manifold assembly 500. For example, the heat transfer device 400 may include screw holes 485 through which screws may be driven to secure the heat transfer device 400 to the ring bus bar 200 and the liquid manifold assembly 500. In some examples, the heat transfer device 400 may also include an attachment strip 480, which extends along one end of the heat transfer device 400 and is raised relative to the base plate 410. The attachment strip 480 may include some of the screw holes 485, and may be to attach to a portion of the liquid manifold assembly 500.

In addition to removing heat from the ring bus bar 200, the heat transfer device 400 may also remove heat from the PSU board 600. Although the heat transfer device 400 is not directly in contact with the PSU board 600, heat may flow still from the PSU board 600 into the heat transfer device 400 through the ring bus bar 200 and the louvered power connectors 310. Specifically, the louvered electrical connectors 211, 221 of the ring bus bar 200 and the louvered power connectors 310 of the midplane PCB 300 are in direct contact with electrical contacts (not visible) on the rear of the PSU board 600, and all of these electrical connections are highly thermally conductive. Thus, heat can flow from the PSU board 600 into the ring bus bar 200 and into the connectors 310 via these electrical contacts, and from the ring bus bar 200 and the connectors 310 the heat can be passed to the heat transfer device 400.

Not only does the heat transfer device 400 thermally couple the ring bus bars 200 to the liquid manifold, in some examples the heat transfer device 400 may also help to electrically ground (earth) the liquid manifold assembly 500 and/or the chassis 11, 12 of the system 10. In particular, the highly thermally conductive material (e.g., copper) forming the base plate 410 may also be electrically conductive, and because the heat transfer device 400 is in contact with the ground bus bars 220 (which are grounded), both it and the liquid manifold assembly 500 are also grounded as a result. In some examples, the chassis 11 and 12 are also in contact with the liquid manifold assembly 500, which may be constructed of a thermally and electrically conductive material (e.g., steel), and thus the chassis 11 and 12 may also be grounded, in part, via the manifold assembly 500 and the heat transfer device 400.

1.4 Ring Shaped Liquid Manifold Assembly

The ring shaped liquid manifold assembly 500 will now be described, with primary reference to FIG. 6 (see also FIGS. 1-3).

Figure 9:
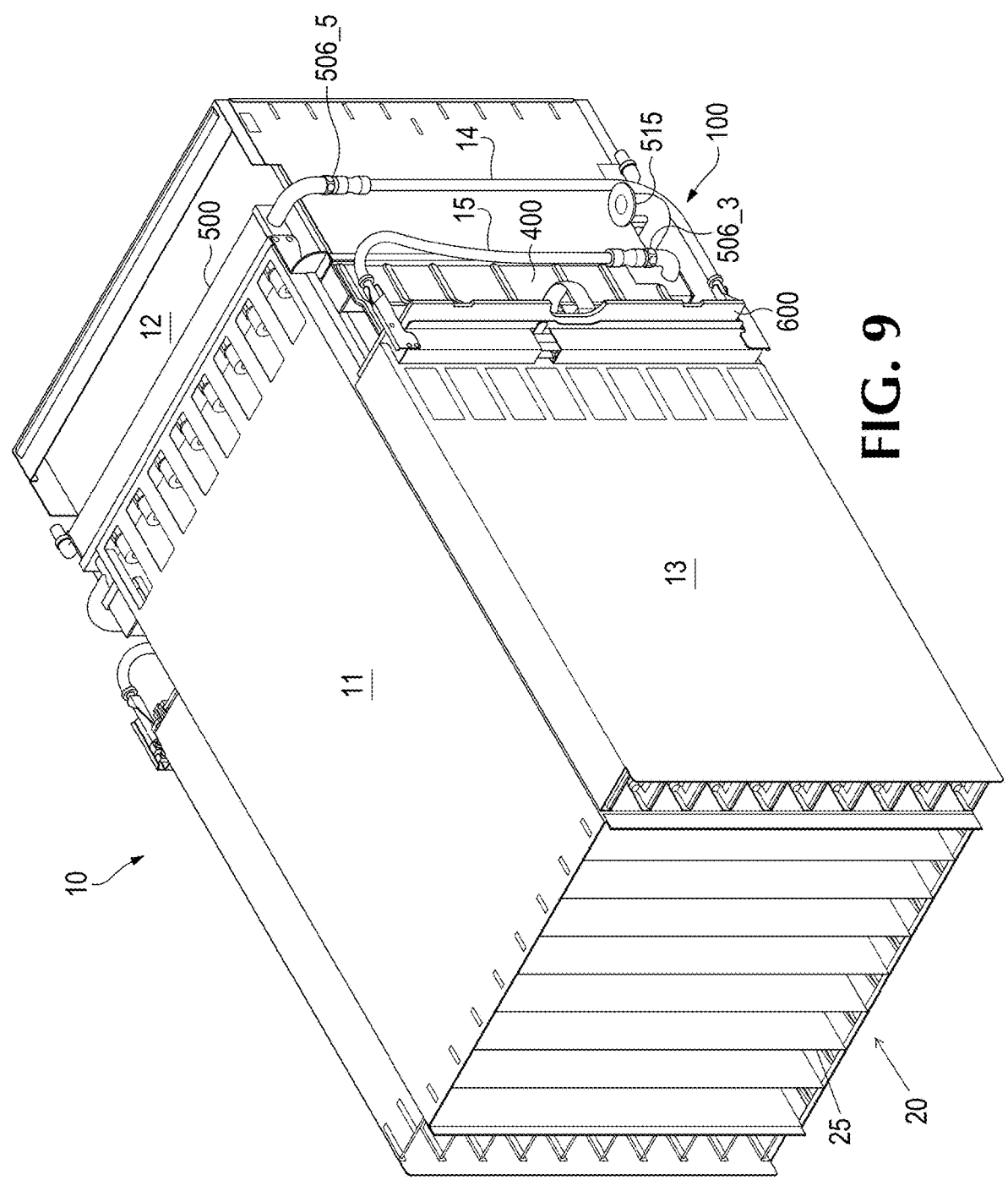
FIG. 9 illustrates a perspective view of an example computing system that includes the example midplane assembly of FIG. 1.
Figure 10:
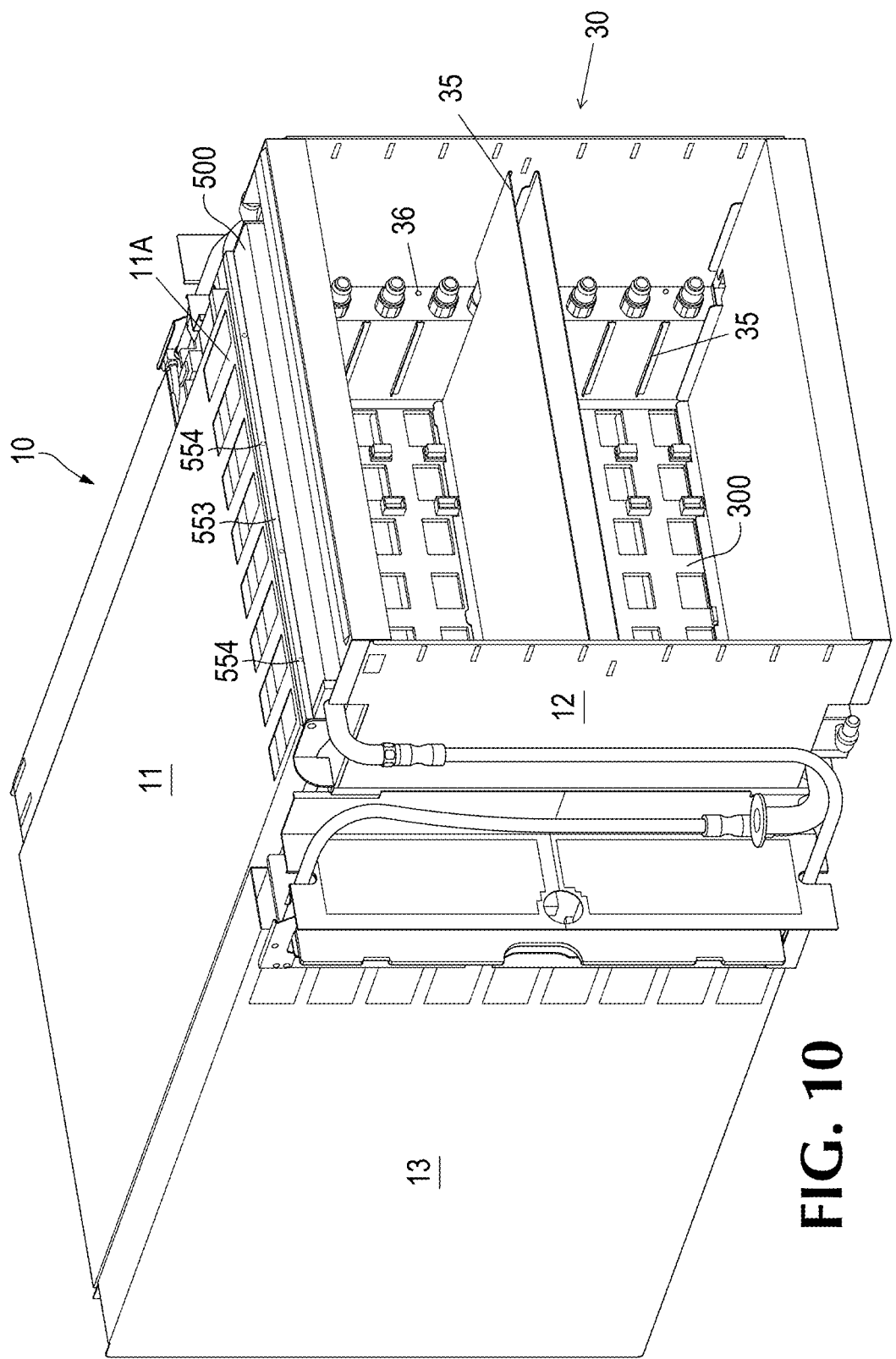
FIG. 10 illustrates another perspective view of the example computing system of FIG. 9.

The ring shaped liquid manifold assembly 500 is included within the computing system 10, at a middle region thereof (see FIGS. 9-10). This is in contrast to manifolds deployed at the rack level (rather than system level), or manifolds located at the rear of a system or rack.

Figure 11:
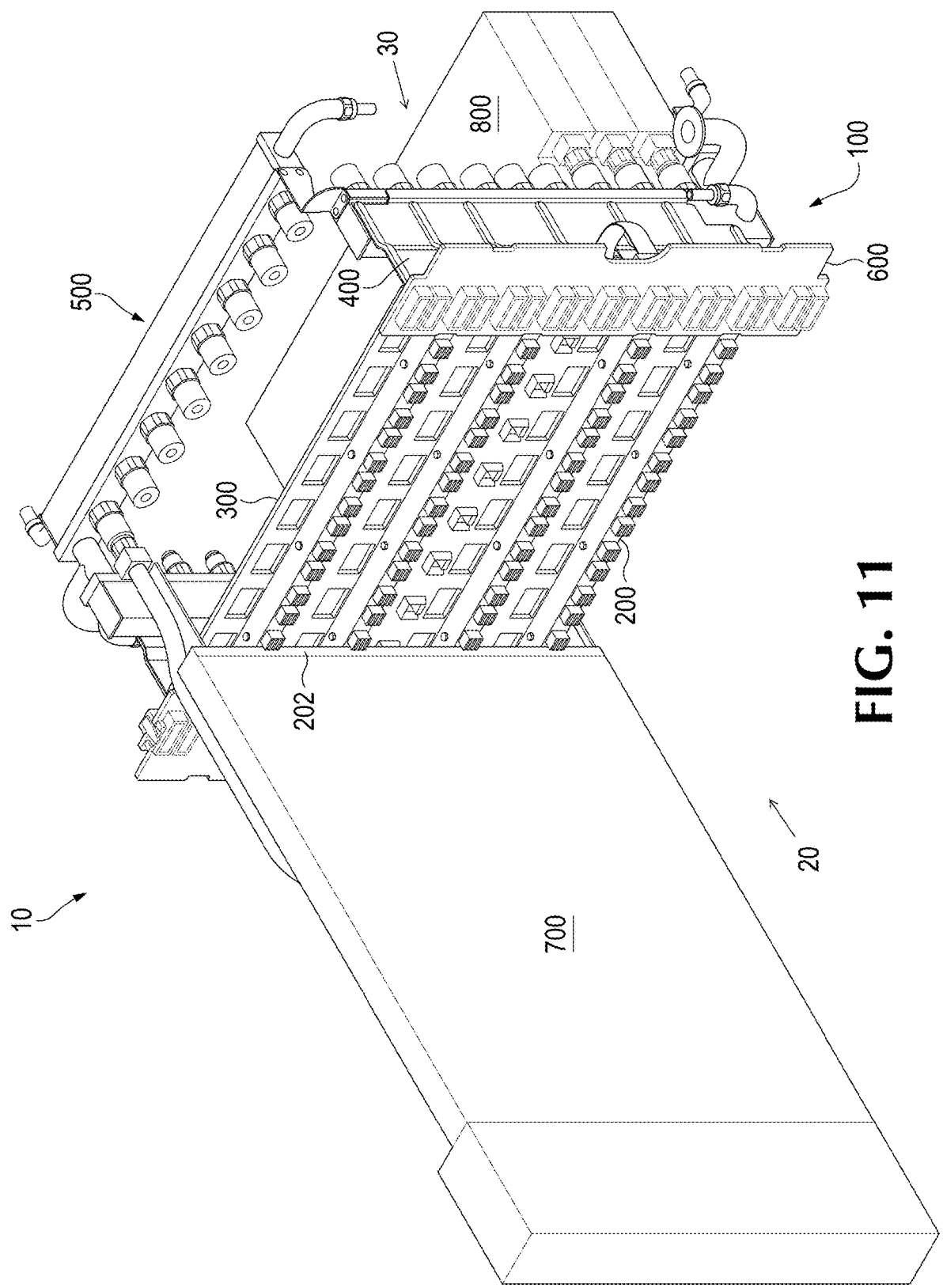
FIG. 11 illustrates a perspective view of an example computing system that includes the example midplane assembly of FIG. 1 with computing devices installed therein.
Figure 12:
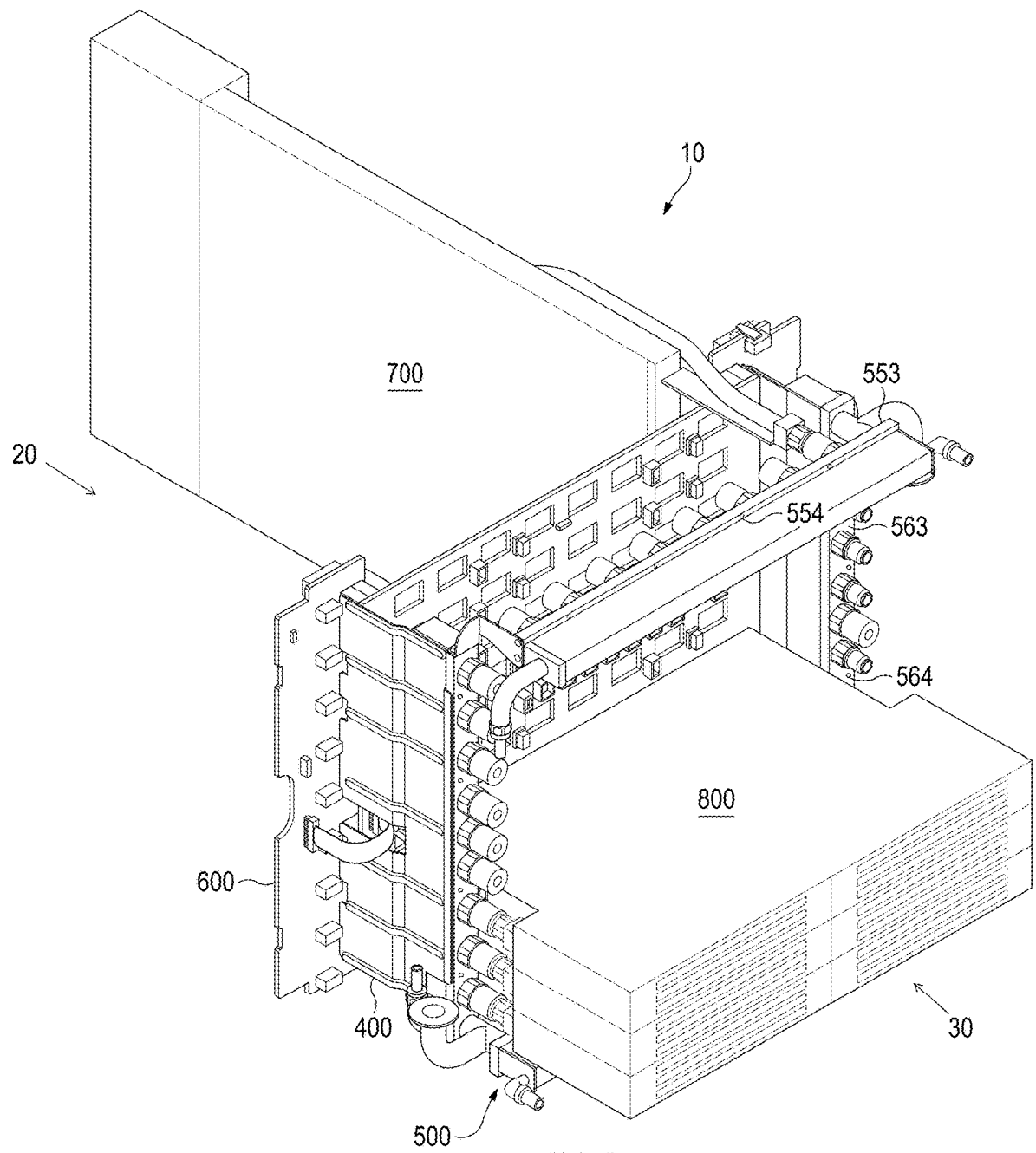
FIG. 12 illustrates another perspective view of the example computing system of FIG. 11.

Importantly, the manifold assembly 500 provides liquid coolant to both the first compartment 20 and the second compartment 30 (see FIGS. 11-12). More specifically, the manifold assembly 500 includes liquid connectors 505 facing in one direction towards the first compartment 30 and liquid connectors 505 facing in the opposite direct towards the second compartment 30, which are configured to enable blind-mate connections with first computing devices 700 and second computing devices 800 as those devices 700, 800 are inserted into the compartments 20, 30 (see FIGS. 11-12).

Figure 6:
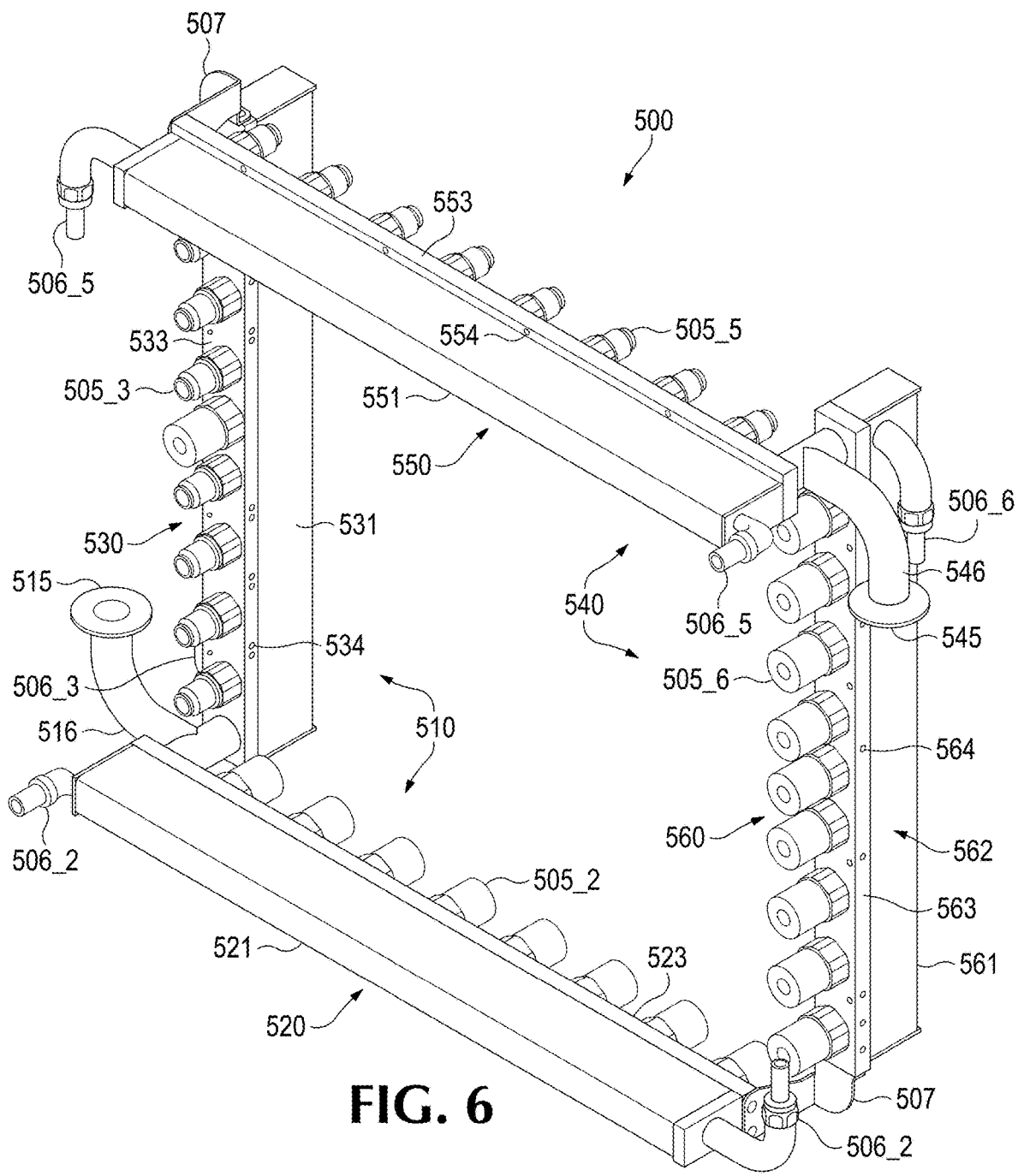
FIG. 6 illustrates a perspective view a liquid manifold assembly of the example midplane assembly of FIG. 1.

As shown in FIG. 6, the manifold assembly 500 includes four segments, which are connected together at the ends thereof to form a rectangular ring. Specifically, the manifold assembly 500 includes a horizontal supply segment 520, a vertical supply segment 530, a horizontal return segment 550, and a vertical return segment 560. Each of these segments includes multiple liquid connectors 505, and acts as a manifold to either distribute liquid coolant to multiple devices 700, 800 or to aggregate liquid coolant received from multiple devices 700, 800.

More specifically, the horizontal supply segment 520 and the vertical supply segment 530 are each supply manifolds, and thus receive liquid from an outside source (e.g., a coolant distribution system) and supply the liquid coolant to the computing devices 700, 800. In particular, one of the segments is to supply liquid coolant to the computing devices 700 and therefore includes liquid connectors 505 that are facing the first compartment 20, while the other is to supply liquid coolant to the computing device 800 and therefore include liquid connectors 505 that are facing the second compartment 30.

In the illustrated example, the horizontal supply segment 520 includes liquid connectors 505_2 that face the first compartment 20, which supply the coolant to the first computing devices 700. The liquid connectors 505_2 are located so as to align with liquid connectors of the first computing devices 700 when the devices 700 are installed in the compartment 20. In particular, the liquid connectors 505_2 are configured to blind mate with liquid connectors of computing devices 700 inserted in a vertical orientation in the first compartment 20. Conversely, the vertical supply segment 530 includes liquid connectors 505_3 that face the second compartment 30, which supply the coolant to the second computing devices 800. The liquid connectors 505_3 are located so as to align with liquid connectors of the second computing devices 800 when the devices 800 are installed in the compartment 30. In particular, the liquid connectors 505_3 are configured to blind mate with liquid connectors of computing devices 800 inserted in a horizontal orientation in the second compartment 30.

The horizontal supply segment 520 and the vertical supply segment 530 are connected to an inlet connector 515, which is to connect to a coolant supply line of the outside coolant source. In the illustrated example, both the horizontal and vertical supply segments 520, 530 are connected to the same inlet connector 515 at a corner of the rectangular ring. In this example, an inlet junction pipe 516 fluidly connects the horizontal and vertical supply segments 520, 530 to the inlet connector 515 (and to one another). The inlet junction pipe 516 also rigidly (structurally) connects the horizontal and vertical supply segments 520, 530 together. The horizontal and vertical supply segments 520, 530, together with the inlet connector 515 and the junction pipe 516, may be referred to collectively as a supply manifold 510, and the liquid connectors 505_2 and 505_3 thereof may be referred to collectively as supply liquid connectors 505.

The horizontal and vertical return segments 550, 560 are configured similarly to the horizontal and vertical supply segments 520, 530. In operation, the horizontal and vertical return segments 550, 560 act as return manifolds, and thus receive the liquid coolant back from the computing devices 700, 800 and return it to the coolant distribution system.

Thus, in the illustrated example, the horizontal return segment 550 includes liquid connectors 505_5 that face the first compartment 20 and receive return coolant from the first computing devices 700, while the vertical return segment 560 includes liquid connectors 505_6 that face the second compartment 30 and receive return coolant from the second computing devices 800. The liquid connectors 505_5 may blind mate with liquid connectors of vertically oriented first computing devices 700, while the liquid connectors 505_6 may blind mate with horizontally oriented second computing device 800.

The horizontal and vertical return segments 550, 560 are connected to an outlet connector 545, which is to connect to a coolant return line of the outside coolant source. In the illustrated example, both the horizontal and vertical return segments 550, 560 are connected to the same outlet connector 545 at a corner of the rectangular ring (opposite from the corner of the inlet connector 515). In this example, an outlet junction pipe 546 fluidly connects the horizontal and vertical return segments 550, 560 to the outlet connector 545 (and to one another). The outlet junction pipe 545 also rigidly (structurally) connects the horizontal and vertical return segments 550, 560 together. The horizontal and vertical return segments 550, 560, together with the outlet connector 545 and the junction pipe 546, may be referred to collectively as a return manifold 540, and the liquid connectors 505_5 and 505_6 may be referred to collectively as return liquid connectors 505.

The supply manifold 510 and the return manifold 540 are rigidly connected to one another via supports 507 at two opposite corners of the ring. In other words, a support 507 rigidly connects one end of the horizontal supply segment 520 to one end of the vertical return segment 560, and another support 507 rigidly connects one end of the horizontal return segment 550 to one end of the vertical supply segment 530. Thus, in the rectangular ring structure, the ends of each segment are rigidly connected to adjacent segments at a corner of the ring, with the inlet/outlet junctions 516/546 being used to connect segments in two corners of the ring and the supports 507 being used to connect segments in the other two corners of the ring.

Each of the segments 520, 530, 550, 560 of the manifold assembly 500 includes a segment housing (521, 531, 551, 561), which has an interior chamber through which the liquid coolant flows. The housing 521 of the vertical supply segment 530 and the housing 561 of the vertical return segment 560 also include thermal interface surfaces 532 and 562, respectively. The thermal interface surfaces 532, 562 are to make flush contact with the heat transfer devices 400

(specifically, with the manifold interface 470 thereof), to thermally couple them together. The segment housings 521, 531, 551, 561 may preferably be formed from a material that is thermally conductive, to facilitate the transfer of heat from the heat transfer plates 400 into the liquid coolant. The material of the segment housings 521, 531, 551, 561 may also preferably, in some circumstances, be rigid and strong enough to provide structural support for the manifold assembly 500, and/or the chassis 11 and 12. Examples of materials that satisfy both of the aforementioned criteria include steel, stainless steel, brass, aluminum.

Each of the segments 520, 530, 550, 560 of the manifold assembly 500 also includes a face plate (523, 533, 553, 563) attached to the segment housings 521, 531, 551, 561. The face plates 523, 533, 553, 563 have openings (ports) (not visible) into which the liquid connectors 505 are attached and through which the liquid connectors are fluidly connected to the interior chamber of the housings 521, 531, 551, 561. The face plates 523, 533, 553, 563 may also include attachment features 524, 534, 554, 564 (such as screw holes) that enable attachment to other parts of the system 10. In particular, the attachment features 524, 534, 554, 564 may be used to attach the heat transfer devices 400, the chassis 11, and the chassis 12 to the manifold assembly 500 (see FIGS. 3 and 10). Thus, in some examples, the manifold assembly 500 not only distributes liquid coolant, but it can also serve as a structural member of the computing system (e.g., helping to secure the chassis 11 and the chassis 12 together).

In some examples, some or all of the segments 520, 530, 550, 560 may have one or more auxiliary liquid connectors 507, which may be fluidly connected to the interior chamber of the segment housings 521, 531, 551, 561. The auxiliary liquid connectors 507 may be used, for example, to provide liquid coolant to portions of the computing system 10 other than the first and second computing devices 700, 800. For example, as shown in FIG. 9, the auxiliary connector 506_3 from the vertical supply segment 530 may be connected to the PSU coolant supply line 15 to supply liquid coolant to one of the PSU chassis 13, while the auxiliary connector 506_5 of the horizontal return segment 560 is connected to the PSU coolant return line 14 to receive the returned liquid coolant from the PSUs. Similarly, auxiliary connectors 506_2 and 506_6 could be used to provide liquid coolant to the other PSU chassis 13 on the opposite side of the system 10.

In the manifold assembly 500, each one of the supply liquid connectors 505_2, 505_3 is paired with a corresponding one of the return liquid connector 505_5, 505_6, such that each such pair of corresponding liquid connectors 505 is to supply and return liquid coolant from the same computing device 700, 800. For example, each supply liquid connector 505_2 is paired with the return liquid connector 505_5 that it is vertically aligned with, such that the paired connectors both connect to the same vertically oriented first computing device 700. Similarly, for example, each of the supply liquid connectors 505_3 is paired with the return liquid connector 505_6 that it is horizontally aligned with, such that the paired connectors both connect to the same horizontally oriented second computing device 800.

In some examples, the liquid connectors 505 are arranged such that, for any given supply liquid connector 505, the distance of that supply liquid connector 505 from the inlet 515 is inversely related to the distance of its corresponding return liquid connector 505 from the outlet 545. In other words, the further from the inlet 515 that a supply connector 505 is, the closer to the outlet 545 its corresponding return connector 505 is. In other words, the supply connector 505_2 closest to the inlet 515 is paired with the return connector 505_5 that is furthest from the outlet 545, the supply connector 505_2 that is second closest to the inlet 515 is paired with the return connector 505_5 that is second furthest from the outlet 545, the supply connector 505_2 that is third closest to the inlet 515 is paired with the return connector 505_5 that is third furthest from the outlet 545, and so on (the same being true for the supply connectors 505_3 and the return connectors 505_6). Such configurations of the connectors 505 may help to ensure that the various flows of liquid coolant flowing through the various computing devices 700 all traverse roughly equal distances as one another, and similarly that the flows going through the computing devices 800 all travers roughly equal distances as one another. This may be referred to as balancing the flow path lengths, and may be beneficial in that it may help to balance flow rates and pressures across the various flow paths.

In the figures, some of the liquid connectors 505 are shown as male (plug) type liquid connectors while others are shown as female (socket) type liquid connectors, but this is merely an example and any types of liquid connectors 505 may be used. For example, in systems where the computing devices 700 need to be installed in a specific orientation, using different types of connectors 505 on opposite segments may help to prevent the computing devices 700, 800 from being installed in an inverted (upside-down) orientation, as the connectors of an inverted computing device would not properly mate with the liquid connectors 505. In other examples, the liquid connectors 505 could all be the same type of liquid connectors. In other examples, the liquid connectors 505 that face the first compartment 20 could be different (e.g., in type, size, shape, etc.) from the liquid connectors 505 that face the second compartment 30.

In the description herein, some of the segments of the manifold assembly 500 are described as supplying liquid coolant (i.e., the supply manifold 510), while others are described as returning liquid coolant (i.e., the return manifold 540). It should be understood that this designation of some features as providing "supply" functionality and some as providing "return" functionality is for purposes of explanation, but that in actual operation these roles could be reversed. In other words, the components described as providing "supply" functionality could instead provide "return" functionality, and vice-versa. Which ones of the components act to supply liquid coolant and which ones to return it will depend on how the system 10 is connected to the external coolant distribution system and the direction in which coolant flows through that system. More specifically, if the connector 515 is connected to a coolant supply line and the connector 545 is connected to a coolant return line in the manner described above, then the features would function as described above. However, if instead the connections were reversed so that the connector 515 were connected to a coolant return line and the connector 545 were connected to a coolant supply line, then the flow of liquid coolant through the manifold 500 would be reversed, and the features described above as supplying liquid coolant would actually return the liquid coolant, and vice-versa.

In some examples, the manifold 500 may be rotationally symmetric and the connectors 515 and 545 and various segments of the manifold 500 may be structurally similar to one another (e.g., the horizontal supply segment 520 is structurally similar to the horizontal return segment 550, and so on). Thus, in some examples, it might not be possible to distinguish "supply" features of a manifold from "return" features of the manifold until the manifold is connected into a liquid cooling system. Moreover, in some examples, either one of the configurations for connecting the manifold 500 into the liquid cooling system may be used without really changing anything about the system other than the direction in which the coolant flows. Thus, when references are made herein and in the claims to concepts that depend on a direction of coolant flow through the manifold 500, such as the concepts of supply, return, inlet, and outlet, it should be understood that these references are merely indicating a capability of the feature to provide that functionality when the manifold is appropriately connected into a liquid coolant system, but not as imposing any requirement that the manifold is currently so connected into the liquid cooling system (unless such connection is specifically stated).

2. Example Computing Systems

FIGS. 9-12 illustrate an example computing system 10. The system 10 is to house multiple first computing device 700 (such as server nodes) vertically oriented in a first compartment 20 and multiple second computing devices 800 (such as switches, a system controller, etc.) horizontally oriented in a second compartment 30. For example, the system 10 may be a high performance computing system, a blade server system, a composable infrastructure system, etc.

The system 10 includes a system chassis that is made up of multiple smaller chassis that are connected together. In particular, the system 10 includes a first chassis 11 that defines the first compartment 20, a second chassis 12 that defines the second compartment 30, and two PSU chassis 13 arranged on opposite sides of the first chassis 11 that are to house PSUs. The midplane assembly 100 is located in a middle region of the computing system 10, with the midplane PCB 300 being between the first compartment 20 and the second compartment 30. The midplane assembly 100 so positioned can provide electrical and liquid coolant connections to both compartments 20, 30.

As noted above, the first chassis 11 defines the first compartment 20, which houses and supports the first computing devices 700. In some examples, the first compartment 20 may include multiple vertical slots in which individual first computing devices 700 may be inserted (see FIG. 9). The slots may be defined by alignment features 25 that guide the devices into their intended installed location, such as: divider walls, rails, grooves, tabs, or the like (see FIG. 9). When a first computing device 700 is installed in the compartment 20, it may blind mate connect with various connectors of the midplane assembly 100, such as the connectors 235 of the ring bus bars 200, the connectors 325 of the midplane PCB 300, and a pair of the liquid connectors 505. The first computing device 700 may also blind mate connect with communications connectors (electrical and/or optical) on second computing devices 800 via the openings 305. In the illustrated example, there are eight slots to receive eight first computing device 700, but this is merely one example and in practice any number of slots could be included in the system 10 (the numbers of electrical connectors and liquid connectors 505 may be changed to accommodate the different numbers of slots).

As noted above, the second chassis 12 defines the second compartment 30, which houses and supports the second computing devices 800. In some examples, the second compartment 30 may include multiple horizontal slots in which individual second computing devices 800 may be inserted (see FIG. 10). The slots may be defined by alignment features 35 that guide the devices into their intended installed location, such as: divider walls, rails, grooves, tabs, or the like (see FIG. 10). When a second computing device 800 is installed in the compartment 30, it may blind mate connect with various connectors of the midplane assembly 100, such as the connectors 330 and 325 of the midplane PCB 300 and a pair of the liquid connectors 505. The second computing devices 800 may also blind mate connect with communications connectors (electrical and/or optical) on first computing devices 700 via the openings 305. In the illustrated example, there are nine slots to receive nine second computing devices 800, but this is merely one example and in practice any number of slots could be included in the system 10 (the numbers of electrical connectors and liquid connectors 505 may be changed to accommodate the different numbers of slots).

FIGS. 11 and 12 illustrate an example in which a first computing device 700 and second computing devices 800 have been installed in the compartments 20, 30 (the various chassis have been omitted from the figures to avoid obscuring details). In some examples, the system 10 does not necessarily include the first computing devices 700, the second computing devices 800, or the PSUs (not illustrated)—for example, the system 10 may be in a state in which none of these devices have yet been installed (e.g., the system chassis may be sold separately from the first computing devices 700, the second computing devices 800, and/or the PSUs). In some examples, when the first computing devices 700 or the second computing devices 800, are installed in the compartments 20, 30, then these components may become part of the system 10. Similarly, when the PSUs are installed in the PSU chassis 13, they may become part of the system 10.

The first chassis 11 and the second chassis 12 may both be affixed to the manifold assembly 500. Thus, the manifold assembly 500 may act as a structural member of the system 10, which helps to hold the first and second chassis 11, 12 together. More specially, as shown in FIG. 10, a portion 11A of the first chassis 11 on the top side thereof may extend forward past the midplane PCB 300 and may be affixed to the face plate 553 of the horizontal return segment 550 via the attachment features 554 and corresponding attachment features (not visible) of the chassis 11. Similar connections (not visible) may also be made between the first chassis 11 and the face plate 523 of the horizontal supply segment 520 on the bottom side of the system 10. In addition, the second chassis 12 may be affixed to the face plate 533 of the vertical supply segment 530 via attachment features 36 of the chassis 12 and the attachment features 534. Similar connections (not visible) may also be made between the second chassis 12 and the face plate 563 of the vertical return segment 560 via the attachment features 564 and corresponding attachment features of the chassis 12.

As noted above, the first computing devices 700 may include server nodes. Such a server node may include a printed circuit assembly (PCA), comprising a printed circuit board (PCB) to which computing components are attached. Such a PCA may be referred to in the art as a system board, a motherboard, a node, a node board, a circuit board, or the like. The computing components attached to the PCB may include, for example, one or more processors, one or more memory modules, and other computing components familiar to those in the art. Such server nodes may be, for example, nodes of a high-performance computing system, blades of a blade system, compute modules of a composable infrastructure system, and so on.

As noted above, the second computing devices 800 may include computing device that are to support or provide additional functionalities to the first computing device 700. For example, the second computing devices may include switches, a system controller, accelerator modules, storage modules, memory modules, and so on.

In the description above, references were made to vertical and horizontal directions or orientations. Vertical should be understood as referring to a direction or orientation that is roughly parallel with the long dimension of the vertical supply segment 530 of the manifold assembly 500, as illustrated in the figures. Horizontal should be understood as referring to a direction or orientation that is roughly parallel with the long dimension of the horizontal supply segment 520 of the manifold assembly, as illustrated in the figures. It should be understood that horizontal and vertical, in this context, are fixed relative to the system 10 and do not necessarily correspond to horizontal and vertical as defined in the external environment in which the system 10 may be placed—for example, depending on how the system 10 is oriented in a given environment, "horizontal" in the system 10 may or may not align with what is considered "horizontal" in the environment.

Heat Transfer Device: As used herein, "heat transfer device" refers to any device that is thermally conductive and that is configured to receive heat from one solid body via conduction (contact) and transfer the heat into a second solid body via conduction (contact). Examples include heat pipes, vapor chambers, heat spreaders, a solid bar or strip of metal, etc.

Heat pipe: As used herein, "heat pipe" refers to a specific type of thermal transfer device that includes a case (vessel) having walls that surround a sealed interior channel containing a working fluid and a wick such that the fluid transfers heat between different regions of the device by a cycle of vaporization and condensation.

Heat sink: As used herein, a "heat sink" is a device that receives heat from a solid body via conduction (contact) and dissipates that heat into air that flows around/through the heatsink. A heat sink is distinguished from other bodies that dissipate heat into air by the fact that the heat sink is specialized for this task, as evidenced by it including features, such as fins or pins, to increase the surface area of its portions that are in contact with the air to improve heat dissipation.

Liquid Cooled Cold Plate or Cold Plate: As used herein, "liquid cooled cold plate" and "cold plate" refer to a device that receives heat from a solid body via conduction (contact) and dissipates that heat into liquid coolant that flows on or through the cold plate. The liquid coolant is either (a) in direct contact with the cold plate (e.g., flowing through an interior chamber of the cold plate) or (b) flowing through a pipe/tube that is in contact with the cold plate.

Thermal Interface Material (TIM): As used herein, "thermal interface material" and "TIM" refer to relatively thin, thermally conductive, and compliant (easily deformable) material placed between two devices at their thermal interface to improve heat transfer rates by filling air gaps that would otherwise occur between the devices due to surface roughness and/or misalignment. Common examples include thermal gap pads, thermal grease, thermal paste.

Thermally couple: As used herein, to "thermally couple" two objects means to provide a thermally conductive pathway between the objects that allows heat to be conducted between the objects. Two objects or entities may be considered to be thermally coupled if any of the following are true: (1) the two objects are in contact with one another (either direct contact, or contact via a TIM), (2) the objects are both thermally coupled to the same thermal transfer device or to a chain of thermally coupled thermal transfer devices, or (3) a heat transfer coefficient between the two objects is 10 $W·m^{-2}·K^{-1}$ or greater.

Thermally conductive: An object, device, or assembly (which may comprise multiple distinct bodies that are thermally coupled, and may include multiple different materials), is "thermally conductive" between two thermal interfaces if any one of the following is true: (1) a heat transfer coefficient between the thermal interfaces is 10 $W·m^{-2}·K^{-1}$ or greater at any temperature between 0° C. and 100° C., (2) the object is a continuous piece of a material that has a thermal conductivity (often denoted k, λ, or κ) between the two interfaces of 1 $W·m^{-1}·K^{-1}$ or greater at any temperature between 0° C. and 100° C., (3) the object is a heat pipe, vapor chamber, continuous body of copper, or continuous body of aluminum. Examples of materials whose thermal conductivity is greater than 1 $W·m^{-1}·K^{-1}$ between 0° C. and 100° C. include almost all metals and their alloys (e.g., copper, aluminum, gold, etc.), some plastics (e.g., TECA-COMP® TC compounds, CoolPoly® D-series Thermally Conductive Plastics), and many other materials.

Highly thermally conductive: An object, device, or assembly (which may comprise multiple distinct bodies that are thermally coupled, and may include multiple different materials), is "highly thermally conductive" between two thermal interfaces if any one of the following is true: (1) a heat transfer coefficient between the thermal interfaces is 1000 $W·m^{-2}·K^{-1}$ or greater at any temperature between 0° C. and 100° C., (2) the object is continuous piece of a material that has a thermal conductivity (often denoted k, λ, or κ) between the two interfaces of 100 $W·m^{-1}·K^{-1}$ or greater at any temperature between 0° C. and 100° C., (3) the object is a heat pipe, vapor chamber, continuous body of copper, or continuous body of aluminum. Examples of materials whose thermal conductivity is 100 $W·m^{-1}·K^{-1}$ or greater between 0° C. and 100° C. include certain types of copper, aluminum, silver, and gold.

Computer. As used herein, a "computer" is any electronic device that includes a processor and that is capable of executing programs comprising machine-readable instructions, including, for example, a server, a converged (or hyperconverged) appliance, a rack-scale system, some storage arrays, a personal computer, a laptop computer, a smartphone, a tablet, etc.

Provide: As used herein, to "provide" an item means to have possession of and/or control over the item. This may include, for example, forming (or assembling) some or all of the item from its constituent materials and/or, obtaining possession of and/or control over an already-formed item.

A number. Throughout this disclosure and in the appended claims, occasionally reference may be made to "a number" of items. Such references to "a number" mean any integer greater than or equal to one. When "a number" is used in this way, the word describing the item(s) may be written in pluralized form for grammatical consistency, but this does not necessarily mean that multiple items are being referred to. Thus, for example, a phrase such as "a number of active optical devices, wherein the active optical devices . . . " could encompass both one active optical device and multiple active optical devices, notwithstanding the use of the pluralized form.

The fact that the phrase "a number" may be used in referring to some items should not be interpreted to mean that omission of the phrase "a number" when referring to another item means that the item is necessarily singular or necessarily plural.

In particular, when items are referred to using the articles "a", "an", and "the" without any explicit indication of singularity or multiplicity, this should be understood to mean that there is "at least one" of the item, unless explicitly stated otherwise. When these articles are used in this way, the word describing the item(s) may be written in singular form and subsequent references to the item may include the definite pronoun "the" for grammatical consistency, but this does not necessarily mean that only one item is being referred to. Thus, for example, a phrase such as "an optical socket, wherein the optical socket . . . " could encompass both one optical socket and multiple optical sockets, notwithstanding the use of the singular form and the definite pronoun.

And/or. Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Various example processes were described above, with reference to various example flow charts. In the description and in the illustrated flow charts, operations are set forth in a particular order for ease of description. However, it should be understood that some or all of the operations could be performed in different orders than those described and that some or all of the operations could be performed concurrently (i.e., in parallel).

While the above disclosure has been shown and described with reference to the foregoing examples, it should be understood that other forms, details, and implementations may be made without departing from the spirit and scope of this disclosure.

What is claimed is:

1. An apparatus to be installed in a computing system, comprising:
   a liquid coolant manifold comprising four segments connected together as a rectangular ring, the liquid coolant manifold including first liquid connectors facing in a first direction and second liquid connectors facing in a second direction opposite the first direction;
   an electrical midplane horizontally offset from the liquid coolant manifold, the electrical midplane including a ring bus bar assembly to receive power from power supply units of the computing system and provide the power to computing components installed in the computing system; and
   a heat transfer device in contact with the ring bus bar assembly and one of the segments of the liquid coolant manifold to thermally couple the ring bus bar assembly with the segment.

2. The apparatus of claim 1,
   wherein the heat transfer device comprises a metal plate and heat pipes attached to the metal plate.

3. The apparatus of claim 1,
   wherein the heat transfer device covers and is in flush contact with a first side of one of the segments across a majority of the first side.

4. The apparatus of claim 1,
   wherein the ring bus bar assembly includes a live ring bus bar and a ground ring bus bar encircling the live ring bus bar.

5. The apparatus of claim 4,
   wherein the heat transfer device is in contact with the ground ring bus bar.

6. The apparatus of claim 4,
wherein the heat transfer device covers and is in flush contact with a side surface of the ground ring bus bar across a majority of surface area of the side surface.

7. The apparatus of claim 1,
wherein the electrical midplane includes a printed circuit board with auxiliary power connectors, and the heat transfer device is in contact with at least one of the auxiliary power connectors.

8. The apparatus of claim 1,
wherein the liquid coolant manifold includes:
  a supply manifold comprising:
    a horizontal supply segment and a vertical supply segment, each comprising supply liquid connectors, and
    an inlet junction fluidly connecting the horizontal and vertical supply segments to an inlet; and
  a return manifold comprising:
    a horizontal return segment and a vertical return segment, each comprising return liquid connectors, and
    an outlet junction fluidly connecting the horizontal and vertical return segments to an outlet; and
wherein the first liquid connectors that face in the first direction include the supply liquid connectors of the horizontal supply segment and the return liquid connectors the horizontal return segment, and
the second liquid connectors that face in the second direction include the supply liquid connectors of the vertical supply segment and the return liquid connectors of the vertical return segment.

9. The apparatus of claim 8,
wherein each of the supply liquid connectors is aligned with a corresponding one of the return liquid connectors, and
for each of the supply liquid connectors, the distance of the supply liquid connector from the inlet is inversely related to the distance of the corresponding return liquid connector from the outlet.

10. A computing system, comprising:
a first chassis to house first computing devices and a second chassis to house second computing devices;
the apparatus of claim 1 attached to the first chassis and the second chassis such that, when the first and second computing devices are installed:
  the electrical midplane is between the first and second computing devices;
  the first liquid connectors service the first computing devices; and
  the second liquid connectors service the second computing devices.

11. The computing system of claim 10,
wherein the first chassis and the second chassis are affixed to the segments of the liquid coolant manifold such that the liquid coolant manifold serves as a support structure to attach the first chassis to the second chassis.

12. A computing system, comprising:
a first chassis to house vertically oriented first computing devices;
a second chassis to house horizontally oriented second computing devices;
an electrical midplane located between the first and second computing devices when the first and second computing devices are installed, the electrical midplane including a ring bus bar assembly to receive power from power supply units and provide the power to the first computing devices when the first computing devices are installed;
a liquid coolant manifold comprising:
  a horizontal supply segment to supply liquid coolant to the first computing devices when the first computing devices are installed;
  a vertical supply segment to supply liquid coolant to the second computing devices when the second computing devices are installed;
  a horizontal return segment to receive liquid coolant from the first computing devices when the first computing devices are installed; and
  a vertical return segment to receive liquid coolant from the second computing devices when the second computing devices are installed;
a first heat transfer device in contact with a first side of the ring bus bar assembly and the vertical supply segment; and
a second heat transfer device in contact with a second side of the ring bus bar assembly and the vertical return segment.

13. The computing system of claim 12,
wherein the first chassis and the second chassis are affixed to the liquid coolant manifold such that the liquid coolant manifold serves as a support structure to attach the first chassis to the second chassis.

14. The computing system of claim 12,
wherein the vertical and horizontal supply segments and the vertical and horizontal return segments are all connected together to form a rectangular ring.

15. The computing device of claim 12,
wherein the vertical and horizontal supply segments are fluidly connected together and to an inlet by an inlet junction; and
the vertical and horizontal return segments are fluidly connected together and to an outlet by an outlet junction.

16. The computing device of claim 12,
wherein the horizontal supply segment and horizontal return segment include liquid connectors that face towards the first chassis; and
the vertical supply segment and vertical return segment include liquid connectors that face towards the second chassis.

17. The computing device of claim 16,
wherein the horizontal supply segment includes an auxiliary supply connector to supply liquid coolant to a first power supply compartment on a first side of the first chassis; and
the vertical return segment includes an auxiliary return connector to receive liquid coolant from the power supply compartment.

18. A liquid coolant manifold apparatus, comprising:
a supply manifold comprising:
  a horizontal supply segment and a vertical supply segment, each comprising liquid connectors, and
  an inlet junction fluidly connecting the horizontal and vertical supply segments to an inlet; and
a return manifold comprising:
  a horizontal return segment and a vertical return segment, each comprising liquid connectors, and
  an outlet junction fluidly connecting the horizontal and vertical return segments to an outlet; and
wherein the supply manifold and the return manifold form a rectangular ring structure in which the liquid connectors of the horizontal supply segment and the horizontal return segment face in a first direction and the liquid connectors of the vertical supply segment and the vertical return segment face in a second direction opposite the first direction.

19. The liquid coolant manifold of claim 18 wherein each of the liquid connectors of the supply manifold is aligned with a corresponding one of the liquid connectors of the return manifold, and for each of the liquid connectors of the supply manifold, the distance of the liquid connector from the inlet is inversely related to the distance of the corresponding liquid connector of the return manifold from the outlet.

20. The liquid coolant manifold of claim 18, wherein the horizontal supply segment is rigidly connected to the vertical return segment, and the horizontal return segment is rigidly connected to vertical supply segment.

* * * * *